США009206328B2

(12) United States Patent
Tregub et al.

(10) Patent No.: US 9,206,328 B2
(45) Date of Patent: *Dec. 8, 2015

(54) POLYTHIOPHENE-CONTAINING INK COMPOSITIONS FOR INKJET PRINTING

(71) Applicant: Kateeva, Inc., Menlo Park, CA (US)

(72) Inventors: Inna Tregub, San Jose, CA (US); Rajsapan Jain, Sunnyvale, CA (US); Michelle Chan, San Francisco, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/553,592

(22) Filed: Nov. 25, 2014

(65) Prior Publication Data

US 2015/0079715 A1 Mar. 19, 2015

Related U.S. Application Data

(63) Continuation of application No. 14/096,656, filed on Dec. 4, 2013, now Pat. No. 8,906,752, and a continuation-in-part of application No. 13/618,157, filed on Sep. 14, 2012, now abandoned.

(60) Provisional application No. 61/898,343, filed on Oct. 31, 2013, provisional application No. 61/535,413, filed on Sep. 16, 2011.

(51) Int. Cl.
*H01L 29/88* (2006.01)
*H01L 29/861* (2006.01)
(Continued)

(52) U.S. Cl.
CPC .............. *C09D 11/52* (2013.01); *C09D 181/02* (2013.01); *H01L 51/0005* (2013.01);
(Continued)

(58) Field of Classification Search
CPC ....... H01L 21/00; H01L 23/12; H01L 23/296; H01L 29/6603; H01L 51/00; H01L 51/0005; H01L 51/0007; H01L 51/0037; H01L 51/0028; H01L 51/0036; H01L 51/442; H01L 51/50; H01L 51/56
USPC ............ 438/99, 82, 608, 141; 257/40, 43, 79, 257/88, 104, 200, 201, 288, 642, 643, 759, 257/E21.006, E21.007, E21.053, E21.077, 257/E21.126, E21.127, E21.227, E21.229, 257/E21.319, E21.352
See application file for complete search history.

(56) References Cited

U.S. PATENT DOCUMENTS 6,087,196 A 7/2000 Sturm et al.
7,201,859 B2 4/2007 Lee et al.
(Continued)

FOREIGN PATENT DOCUMENTS

EP 2 413 664 2/2002
EP 2 150 556 1/2011
(Continued)

OTHER PUBLICATIONS

H. Jin, Dissertation, Title page, Index and Chapter 5: Profile Optimization for Wet-Printed Polymer Films, pp. 1-9 and 76-118, dated Jan. 2010.
(Continued)

*Primary Examiner* — David Nhu

(57) ABSTRACT

Ink compositions comprising polythiophenes and aprotic organic solvents that are formulated for inkjet printing the hole injecting layer (HIL) of an organic light emitting diode (OLED) are provided. Also provided are methods of inkjet printing the HILs using the ink compositions.

22 Claims, 12 Drawing Sheets

(51) Int. Cl.
*C09D 11/52* (2014.01)
*H01L 51/00* (2006.01)
*H01L 51/56* (2006.01)
*C09D 181/02* (2006.01)
*H01L 51/50* (2006.01)

(52) U.S. Cl.
CPC ....... *H01L 51/0007* (2013.01); *H01L 51/0036* (2013.01); *H01L 51/0037* (2013.01); *H01L 51/56* (2013.01); *H01L 51/5088* (2013.01)

(56) References Cited

U.S. PATENT DOCUMENTS

| | | | |
|---|---|---|---|
| 7,244,960 | B2 | 7/2007 | Spreitzer et al. |
| 7,550,915 | B2 | 6/2009 | Stegamat et al. |
| 7,569,158 | B2 | 8/2009 | Waller et al. |
| 7,989,091 | B2 | 8/2011 | Langer et al. |
| 8,431,925 | B2 | 4/2013 | Li et al. |
| 8,470,205 | B2 | 6/2013 | Zheng |
| 8,784,690 | B2 | 7/2014 | Badre et al. |
| 8,906,752 | B2 * | 12/2014 | Tregub ............... H01L 51/0037 438/99 |
| 2005/0067949 | A1 | 3/2005 | Natarajan et al. |
| 2005/0153568 | A1 | 7/2005 | Gupta et al. |
| 2005/0175861 | A1 | 8/2005 | Elschner et al. |
| 2007/0131914 | A1 | 6/2007 | Elschner et al. |
| 2008/0022885 | A1 | 1/2008 | Sun |
| 2008/0241414 | A1 | 10/2008 | Kim et al. |
| 2009/0103284 | A1 | 4/2009 | Suzuki et al. |
| 2010/0224867 | A1 | 9/2010 | Heuft et al. |
| 2011/0028730 | A1 | 2/2011 | Konemann et al. |
| 2011/0180787 | A1 | 7/2011 | Cho et al. |
| 2011/0267390 | A1 | 11/2011 | Bulovic et al. |
| 2011/0315976 | A1 | 12/2011 | Suh et al. |
| 2012/0043530 | A1 | 2/2012 | Badre et al. |
| 2012/0080666 | A1 | 4/2012 | Hayashi et al. |
| 2012/0256137 | A1 | 10/2012 | James et al. |
| 2012/0261651 | A1 | 10/2012 | Noto et al. |
| 2013/0026421 | A1 | 1/2013 | James et al. |
| 2013/0092887 | A1 | 4/2013 | Seshadri et al. |
| 2013/0112927 | A1 | 5/2013 | Hayashi et al. |
| 2013/0252351 | A1 | 9/2013 | Tregub et al. |
| 2013/0256603 | A1 | 10/2013 | Chesterfield et al. |
| 2013/0277662 | A1 | 10/2013 | Sukekazu et al. |

FOREIGN PATENT DOCUMENTS

| | | |
|---|---|---|
| WO | WO 2011/075644 | 6/2011 |
| WO | WO 2012/059215 | 5/2012 |
| WO | WO 2012/088194 | 6/2012 |
| WO | WO 2012/091005 | 7/2012 |

OTHER PUBLICATIONS

D. Soltman, Understanding Inkjet Printed Pattern Generation, Dissertation in Engineering—Electrical Engineering and Computer Sciences, University of California, Berkeley, dated May 5, 2011.
Still et al., Surfactant-Induced Marangoni Eddies Alter the Coffee-Rings of Evaporating Colloidal Drops, Langmuir, vol. 28, Feb. 27, 2012, pp. 4984-4988.
International Search Report and Written Opinion issued on Jan. 21, 2013 to PCT Application No. PCT/US2012/055594.
International Search Report and Written Opinion issued on Apr. 25, 2014 to PCT Application No. PCT/US2013/073175.
*Ex-Parte Quayle* issued on Oct. 9, 2014, to U.S. Appl. No. 14/096,656.
Notice of Allowance issued on Oct. 31, 2014, to U.S. Appl. 14/096,656.

* cited by examiner

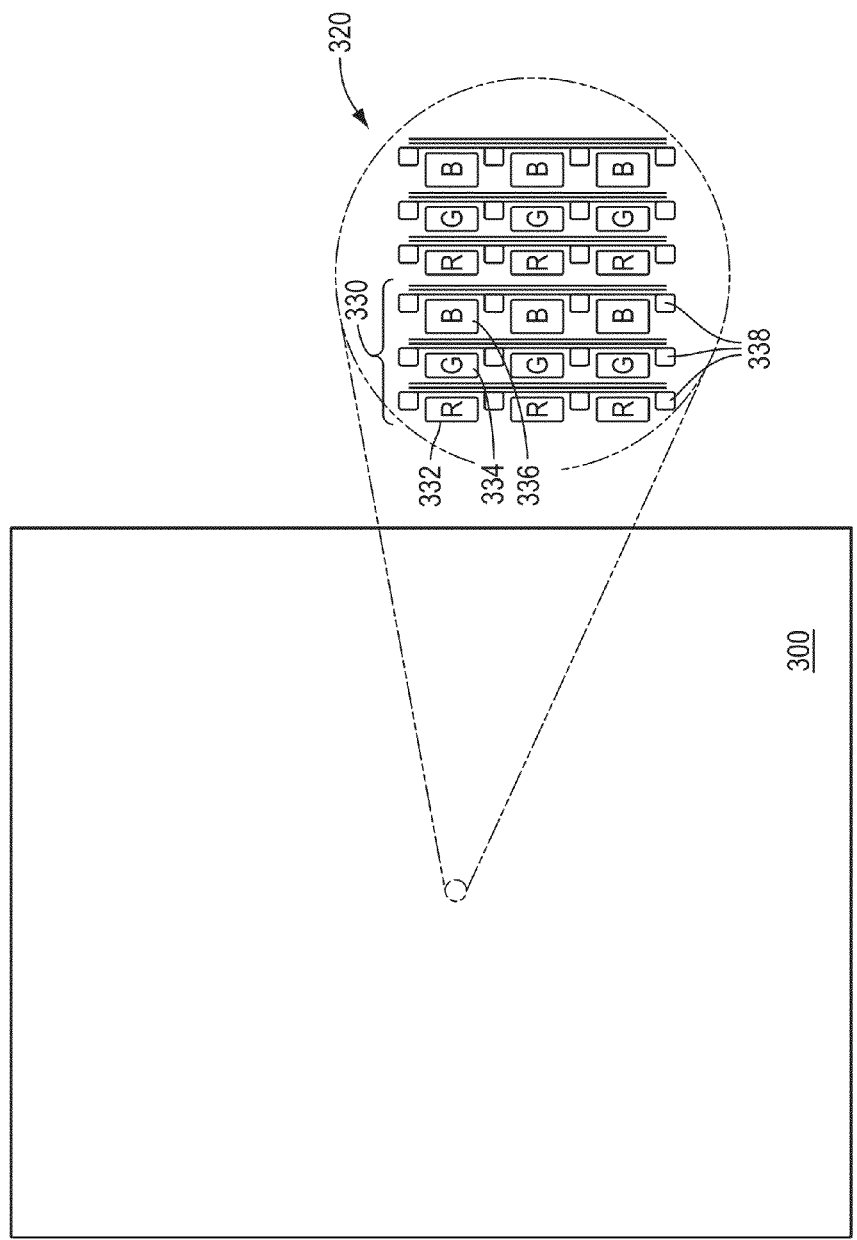

500

500

POLYTHIOPHENE-CONTAINING INK COMPOSITIONS FOR INKJET PRINTING

CROSS-REFERENCE TO RELATED APPLICATION

This application is a continuation case of U.S. patent application Ser. No. 14/096,656, entitled, "Polythiophene-Containing Ink Compositions For Inkjet Printing," which was filed on Dec. 4, 2013. U.S. patent application Ser. No. 14/096,656 claims benefit of U.S. provisional patent application No. 61/898,343, entitled, "Polythiophene-Containing Ink Compositions For Inkjet Printing," which was filed on Oct. 31, 2013. U.S. patent application Ser. No. 14/096,656, is also a continuation-in-part of U.S. patent application Ser. No. 13/618,157, entitled, "Film-Forming Formulations for Substrate Printing," which was filed on Sep. 14, 2012. U.S. patent application Ser. No. 13/618,157 claims benefit of U.S. provisional patent application No. 61/535,413, entitled, "Film-Forming Formulations for Substrate Printing," which was filed on Sep. 16, 2011. All applications named in this section are incorporated herein by reference in their entirety.

BACKGROUND

Ink compositions for inkjet printing layers in organic light emitting diodes (OLEDs) have been proposed. However, problems associated with inadequate wetting properties of the ink compositions has stifled the development of printable inks because improper wetting leads to non-uniform film formation and, therefore, non-uniform luminescence from organic light emitting diode pixels that incorporate the printed films. Another challenge that has impeded the development of inkjet printable compositions for OLED applications is the inability to incorporate high concentrations of active polymers into the inks, while maintaining a jettable ink formulation.

SUMMARY

Ink compositions comprising polythiophenes that are formulated for inkjet printing the hole injecting layer (HIL) of an OLED are provided. Some embodiments of the ink compositions are characterized by the inclusion of a methicone as a pinning agent. Others are characterized by the inclusion of aprotic solvents that enable the incorporation of high concentrations of the polythiophene in the inks. Also provided are methods of inkjet printing HILs using the ink compositions.

One embodiment of a method of forming an HIL for an organic light emitting diode comprises the steps of: inkjet printing a droplet (that is, at least one droplet) of an ink composition over an electrode layer in a pixel cell of an organic light emitting diode, the pixel cell defined by a pixel bank; and allowing the volatile components of the ink composition to evaporate, whereby the hole injecting layer is formed. An embodiment of an ink composition that can be used in the method comprises: an electrically conductive polythiophene; water; at least one organic solvent; and methicone, wherein the methicone is present in an amount that provides contact line pinning of the droplet in the pixel cell.

Some embodiments of the ink compositions comprise: poly(3,4-ethylenedioxythiophene); water; at least one organic solvent having a surface tension no greater than 55 dyne/cm at 25° C., a viscosity no greater than 15 cPs at 25° C., and a boiling point of at least 200° C.; and methicone. The at least one organic solvent can be, for example, sulfolane.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 3 is a schematic illustration of a flat panel display comprising a plurality of OLEDs arranged in a matrix of pixel cells, each pixel cell being defined by a pixel bank.

DETAILED DESCRIPTION

Figure 1:
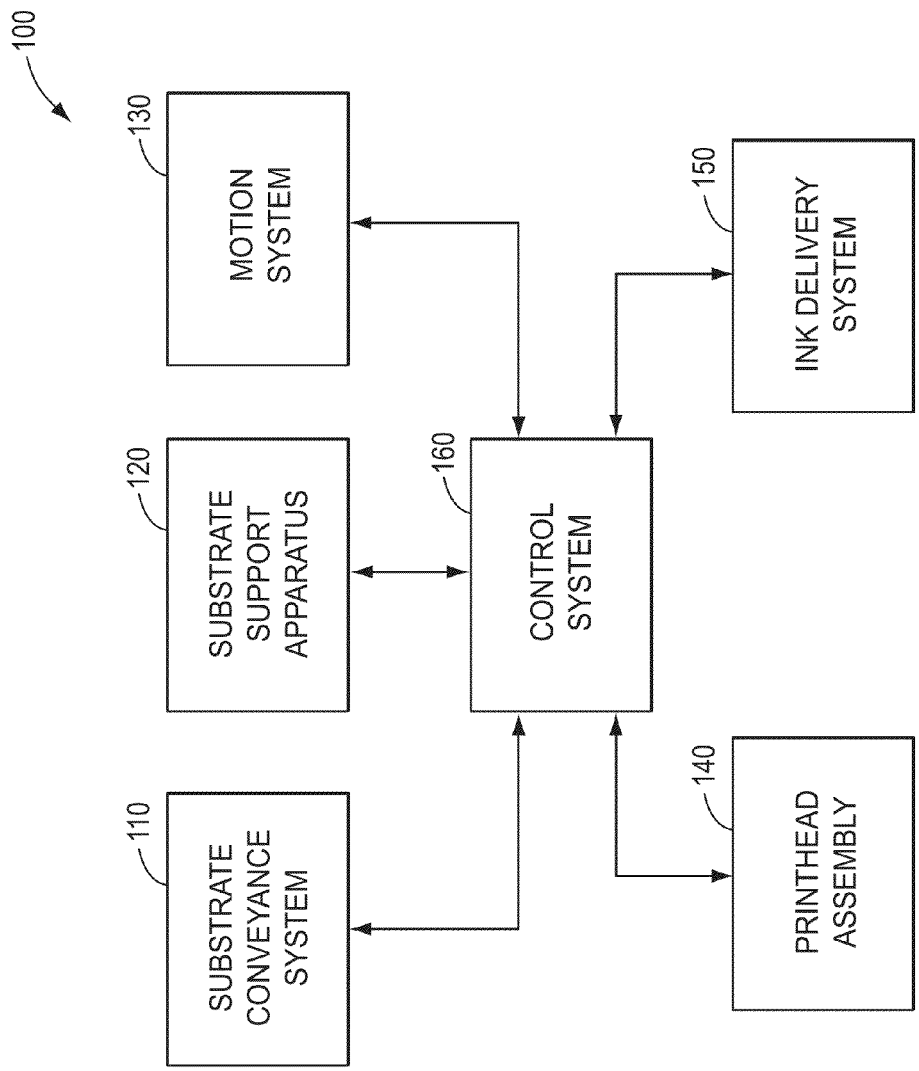
FIG. 1 is a block diagram that illustrates an OLED inkjet printing system.

Ink compositions comprising polythiophenes that are formulated for inkjet printing the HIL of an OLED are provided. Also provided are methods of inkjet printing the HILs using the ink compositions.

The ink compositions are characterized by high concentrations of electrically conducting polythiophenes, such as poly (3,4-ethylenedioxythiophene) (PEDOT), yet provide wetting, jetting and latency properties that render them well-suited for inkjet printing onto pixilated substrates, such as OLED pixel cells. In addition, the ink compositions provide printed HILs having highly uniform thicknesses and homogenous compositions. As a result, the printed HILs contribute to a highly uniform light emission profile for OLEDs into which they are incorporated. The enhanced printability provided by the ink compositions can be attributed, at least in part, to the realization that, at an appropriate concentration, methicone can act as a contact line pinning agent for droplets of the ink compositions in a pixel cell. By providing contact line pinning, the methicone ensures that the footprint of a droplet of the ink composition deposited into a pixel cell remains unchanged from its initial form during the process of drying.

A basic embodiment of the ink compositions is an aqueous solution comprising an electrically conductive polythiophene, methicone, at least one organic solvent and water. A basic embodiment of a method of forming an HIL for an OLED using one of the ink compositions comprises the steps of depositing a droplet of the ink composition over a layer of electrically conductive material (i.e., an anode) in a pixel cell of an organic light emitting diode array and allowing the volatile components of the ink composition to evaporate, leaving a solid HIL. The step of allowing the volatile components (e.g., water and organic solvents) to evaporate may be facilitated by subjecting the printed ink composition to reduced pressure, that is—exposing it to a vacuum, by exposing the printed ink composition to elevated temperatures, or a combination of the two.

Methicones are silicone oils polymerized from siloxanes. They are also referred to as methyl hydrogen siloxanes or methyl siloxanes. Methicones are commercially available and sold as surfactants by Botanigenics (Northridge, Calif.) under the tradename Botanisil®. These include Botanisil® AD-13, AM-14, ATC-21, BPD-100, CD-80, CD-90, CE-35, CM-12, CM-13, CM-70, CP-33, CPM-10, CS-50, CTS-45, DM-60M, DM-85, DM-90, DM-91, DM-92, DM-93, DM-94, DM-95, DM-96, DM-97, DTS-13, DTS-35, GB-19, GB-20, GB-23, GB-25, GB-35, L-23, ME-10, ME-12, PSS-150, PT-100, S-18, S-19, S-20, TSA-16, and TSS-1. Methicones are also available from the Lubrizol Corporation (Wickliffe, Ohio) under the tradename SilSense®. These include SilSense® Copolyol-1 Silicone (PEG-33 (and) PEG-8 Dimethicone (and) PEG 14), SilSense® DW-18 Silicone (Dimethicone PEG-7 Isostearate), SilSense® SW-12 Silicone (Dimethicone PEG-7 Cocoate), SilSense® IWS (Dimethiconol Ester Dimethiconol Stearate), SilSense® A-21 Silicone (PEG-7 Amodimethicone), SilSense® PE-100 Silicone (Dimethicone PEG-8 Phosphate), and Ultrabee™ WD Silicone (Dimethicone PEG-8 Beeswax).

In the present ink compositions, the amount of methicone is carefully controlled, such that the methicone acts as a contact line pinning agent. This is important because it prevents the pinned ink composition droplets from pulling away from portions of the banks of the pixel cell (dewetting), which is sometimes accompanied by over-spill at other portions of the pixel cell. It also prevents the ink compositions from piling up at the sides of, or spreading beyond, the pixel cells, as would happen with more complete wetting.

The ink compositions can be used to form HILs on a variety of OLED electrode materials. Most commonly, the electrode substrate will comprise a transparent electrically conductive material, such as a transparent conductive oxide (TCO) or silicon. The appropriate concentration range for methicone in an ink composition will depend on the nature of the underlying substrate. However, for a given substrate, the concentration range at which the methicone provides contact line pinning can be determined by observing the wetting behavior of ink droplets having different methicone concentrations that have been applied to the surface via a drop casting process. By way of illustration, some embodiments of the present ink compositions comprise methicone in an amount of no greater than 0.15 weight percent (wt. %), no greater than 0.12 wt. % or no greater than 0.1 wt. %, based on the total weight of the ink composition. This includes embodiments of the ink compositions in which methicone is present in an amount in the range from 0.02 to 0.15 wt. %, further includes embodiments in which methicone is present in an amount in the range from 0.03 to 0.12 wt. %, and still further includes embodiments in which methicone is present in an amount in the range from 0.05 to 0.1 wt. %, based on the total weight of the ink composition. Such ranges are suitable when the HIL ink compositions are printed onto known anode materials used in OLED devices. For example, in the case of an OLED device where the light is emitted through the anode (termed bottom emitting), a transparent or translucent anode material is used. Transparent or translucent anode materials can include indium oxide, zinc oxide, indium tin oxide (ITO), and indium zinc oxide (IZO) or the like. In the case of an OLED device where the light is emitted through the cathode (termed top emitting), a reflective layer is formed below the transparent anode. Reflective layer materials can include silver (Ag), silver-palladium-copper (APC), silver-rubidium-gold (ARA), molybdenum-chromium (MoCr) or the like.

The aqueous ink compositions further include one or more electrically conducting polythiophenes. For example, PEDOT and mixtures of PEDOT with poly(styrenesulfonate) (PEDOT:PSS) may be included in the ink compositions. Notably, in combination with appropriate solvents, as discussed in greater detail below, the polythiophenes can be included in the ink compositions at very high concentrations. For example, some embodiments of the ink compositions comprise at least 30 wt. % polythiophene, at least 40 wt. % polythiophene, at least 50 wt. % polythiophene, at least 55 wt. % polythiophene, or at least 60 wt. % polythiophene, based on the total weight of the ink composition. In such embodiments, the polythiophene can be PEDOT.

The aqueous ink compositions comprise at least one organic solvent. For example, a composition may comprise a solvent that reduces the surface tension and/or viscosity of the composition, a solvent that increases the latency of the printed ink composition, or a combination of these types of solvents. The at least one organic solvent can be a solvent having a relatively high boiling point that increases the latency of the printed ink compositions. This is advantageous because it helps to prevent the ink compositions from drying onto and clogging print nozzles during printing. Such solvents desirably have boiling points of at least 200° C. More desirably they have boiling points of at least 230° C., at least 250° C. or even at least 280° C. Diols and glycols, such as propanediols, pentanediols, diethylene glycols and triethylene glycols, are examples of organic solvents that can be used to increase latency. Unfortunately, however, the diols and glycols tend to have relatively high viscosities and surface tensions, which can degrade the jettability of ink compositions that include them. Therefore, some embodiments of the present ink compositions are free of diol and glycol solvents. In these embodiments, aprotic solvents having boiling points of at least 240° C., viscosities of no greater than 15 cPs and surface tensions of no greater than 55 dyne/cm, can be used instead of diols or glycols. This includes aprotic solvents having viscosities of no greater and 12 cPs and further includes those having viscosities of no greater than 10 cPs. For the purposes of this disclosure, the recited boiling points refer to boiling points at atmospheric pressures. The recited viscosities and surface tensions refer to viscosities and surface tensions at the printing temperature. For example, if printing occurs at room temperature, the viscosities and surface tensions will be those at about 25° C.

Sulfolane, 2,3,4,5-tetrahydrothiophene-1,1-dioxide, also known as tetramethylene sulfone, is an example of a relatively high boiling, relatively lower viscosity aprotic solvent that provides good latency without sacrificing jettability. Moreover, ink compositions that include sulfolane as an organic solvent can incorporate high concentrations of both the solvent and the polythiophene, while maintaining good jettability. For example, the ink compositions may comprise sulfolane in amounts of at least 5 wt. %, at least 10 wt. % or at least 12 wt. %. Suitable concentration ranges for the sulfolane in the ink compositions include the range from about 3 wt. % to about 15 wt. %. At these sulfolane concentrations, the ink compositions can incorporate high concentrations of PEDOT (e.g., 35 to 70 wt. %). In some of the ink compositions, sulfolane is the majority solvent, that is, it makes up greater than 50 wt. % of the total organic solvent content of the ink composition. Other suitable solvents include propylene carbonate and 1,3-dimethyl-3,4,5,6-tetrahydro-2(1H)-pyrimidinone, also known as dimethylpropylene urea.

The ink compositions can further include a co-solvent that acts as a surface-tension reducer in order to enhance the jettability of the composition. For example, ink compositions comprising diols, glycols, sulfolane or other high boiling point solvents may include an additional solvent having a lower surface tension and, typically, a lower boiling point, than those solvents. Propylene glycol methyl ethers or other similar ethers may be used for this purpose.

Generally, for ink compositions useful for inkjet printing applications, the surface tension, viscosity, latency and wetting properties of the ink compositions should be tailored to allow the compositions to be dispensed through an inkjet printing nozzle without drying onto or clogging the nozzle at the temperature used for printing (e.g., room temperature; ~25° C.). Thus, the optimal properties will vary depending upon such factors as nozzle dimensions, printing speed and printing temperature. Generally, acceptable viscosities will include those in the range from about 1 to about 20 cPs and acceptable surface tensions will include those below about 50 dynes/cm. In order to eliminate or minimize nozzle clogging, latencies of 20 minutes or longer (e.g., 30 minutes or longer) (at room temperature and without vacuum) are desirable, where latency refers to the time that nozzles can be left uncovered and idle before there is a significant reduction in performance, for instance a reduction in drop velocity that will noticeably affect the image quality.

Inkjet printers suitable for printing the ink compositions are commercially available and include drop-on-demand printheads, available from, for example, Fujifilm Dimatix (Lebanon, N.H.), Trident International (Brookfield, Conn.), Epson (Torrance, Calif.), Hitachi Data systems Corporation (Santa Clara, Calif.), Xaar PLC (Cambridge, United Kingdom), and Idanit Technologies, Limited (Rishon Le Zion, Isreal) and Ricoh Printing Systems America, Inc. (Simi Valley, Calif.). For example, the Dimatix Materials Printer DMP-3000 may be used.

As depicted in the block diagram of FIG. 1, various embodiments of OLED inkjet printing system 100 can be comprised of several devices, apparatuses and systems and the like, which allow the reliable placement of ink drops onto specific locations on a substrate. According to various embodiments of systems and methods, a printing system can include, for example, but not limited by, a substrate conveyance system 110, a substrate support apparatus 120, a motion system 130, a printhead assembly 140, an ink delivery system 150, and a control system 160.

An OLED substrate can be inserted and removed from printing system 100 using a substrate conveyance system 110. Depending on various embodiments of printing system 100, substrate conveyance system 110 can be a mechanical conveyor, a substrate floatation table with a gripper assembly, a robot with end effector, and combinations thereof. Additionally, during a printing process, a substrate can be supported by support apparatus 120, which can be, for example, but not limited by, a chuck or a floatation table. As printing requires relative motion between the printhead and the substrate, various embodiments of printing system 100 can have motion system 130, which can be, for example, but not limited by, a gantry or split axis XYZ system.

Printhead assembly 140 can include at least one printhead device that can be mounted to motion system 130. The at least one printhead device included in printhead assembly 140 can have at least one inkjet printhead capable of ejecting drops of an ink composition at a controlled rate, velocity, and size through at least one orifice. Various embodiments of printing system 100 according to the present teachings can have between about 1 to about 60 printhead devices. Additionally, various embodiments of a printhead device can have between about 1 to about 30 inkjet printheads in each printhead device, where each inkjet printhead can have between about 16 to about 2048 nozzles. According to various embodiments of printhead assembly 140, each nozzle of each inkjet printhead can expel a drop volume of between about 0.1 pL to about 200 pL. Printhead assembly 140 with at least one inkjet printhead can be in fluid communication with an ink composition delivery system 150, which can supply an ink composition to one or more inkjet printheads of printhead assembly 140.

Regarding various embodiments of motion system 130, during a printing process, either printhead assembly 140 can move over a stationary substrate (gantry style), or both printhead assembly 140 and a substrate can move, in the case of a split axis configuration. For various embodiments of a split axis configuration, Z axis control can be provided by moving printhead assembly 140 relative to a substrate. In still another embodiment of a motion system, printhead assembly 140 can be fixed, and a substrate can move in the X and Y axes relative to printhead assembly 140, with Z axis motion provided either by Z-axis movement of printhead assembly 140 or by Z-axis movement of a substrate. During a printing process, as printhead assembly 140 moves relative to a substrate, drops of an ink composition are ejected at the correct time to be deposited in the desired location on a substrate.

For various embodiments of printing system 100, control system 160 can be used to control the functions of the printing process. Various embodiments of control system 160 can be accessible to an end user through a user interface. Control system 180 can be used to control, send, and receive data to and from substrate conveyance system 110, substrate support apparatus 120, motion system 130, printhead assembly 140, and an ink composition delivery system 150. Control system 160 can be a computer system, a microcontroller, an application specific integrated circuit (ASIC), a field programmable gate array (FPGA), an electronic circuit capable of sending and receiving control and data information and capable of executing instructions, and combinations thereof. Control system 160 can include one electronic circuit or multiple electronic circuits distributed among substrate conveyance system 110, substrate support apparatus 120, motion system 130, printhead assembly 140, and an ink composition delivery system and 150 for the purpose of providing communication between components, for example.

Additionally, for various embodiments of control system 160 of printing system 100 can provide data processing, display and report preparation functions. All such instrument control functions may be dedicated locally to printing system 100, or control system 160 can provide remote control of part or all of the control, analysis, and reporting functions. Finally, various embodiments of printing apparatus 100 can be housed in enclosure 200 of FIG. 2.

Figure 2:
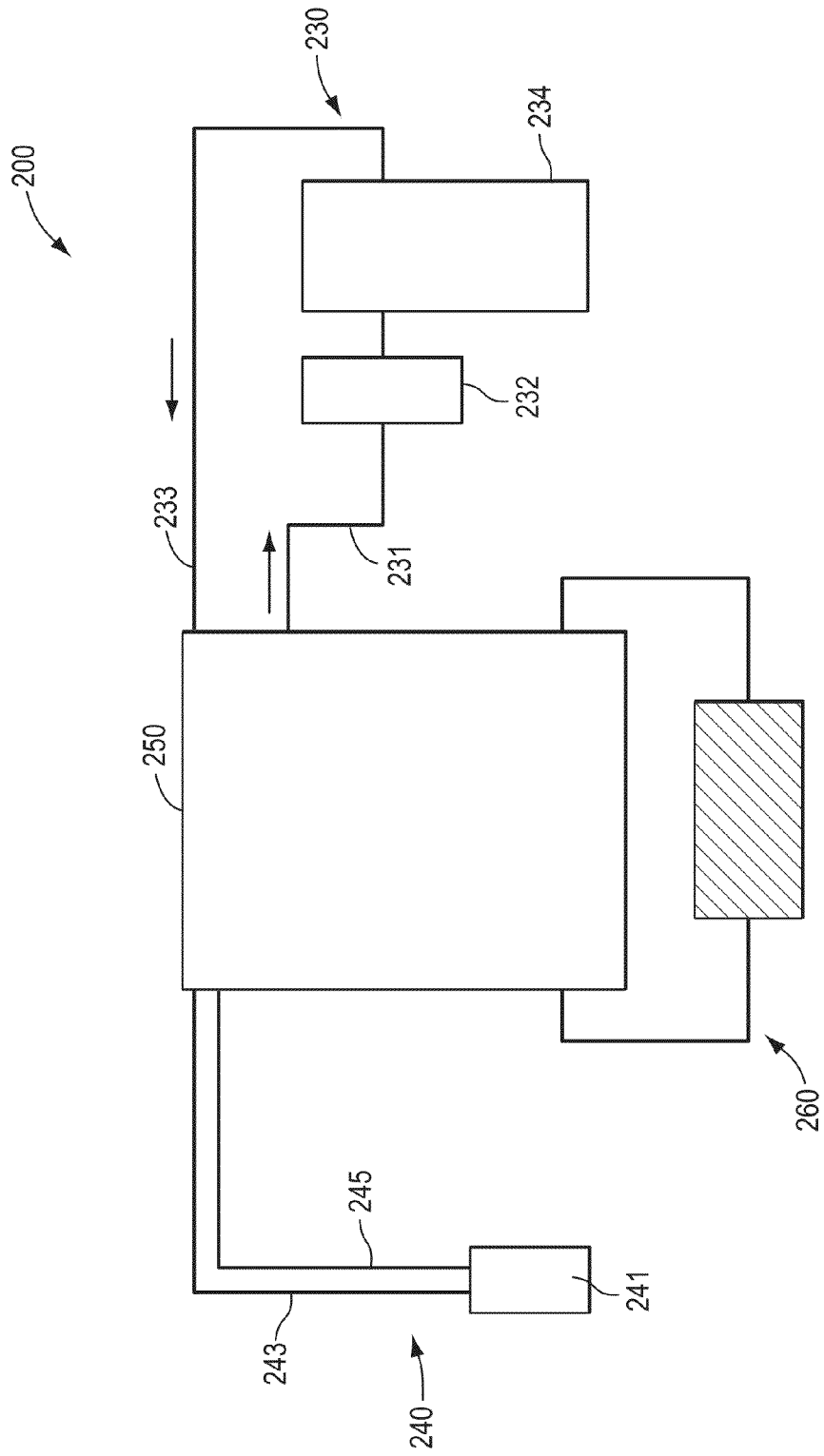
FIG. 2 is a schematic representation of gas enclosure system that can house the printing system shown in FIG. 1

FIG. 2 is a schematic representation of gas enclosure system 200 that can house printing system 100 of FIG. 1, in accordance with various embodiments. Various embodiments of a gas enclosure system 200 can comprise a gas enclosure assembly 250 according to the present teachings, a gas purification loop 230 in fluid communication with gas enclosure assembly 250, and at least one thermal regulation system 240. Additionally, various embodiments of a gas enclosure system can have pressurized inert gas recirculation system 260, which can supply inert gas for operating various devices, such as a substrate floatation table for an OLED printing system. Various embodiments of a pressurized inert gas recirculation system 260 can utilize a compressor, a blower and combinations of the two as sources for various embodiments of inert gas recirculation system 260. Additionally, gas enclosure system 200 can have a filtration and circulation system (not shown) internal to gas enclosure system 200, which along with other components, such as a floatation table, can provide a substantially low-particle printing environment.

As depicted in FIG. 2, for various embodiments of gas enclosure assembly 200 according to the present teachings, gas purification loop 230 can include outlet line 231 from gas enclosure assembly 250, to a solvent removal component 232, and then to gas purification system 234. Inert gas purified of solvent and other reactive gas species, such as oxygen and water vapor, are then returned to gas enclosure assembly 250 through inlet line 233. Gas purification loop 230 may also include appropriate conduits and connections, and sensors, for example, oxygen, water vapor and solvent vapor sensors. A gas circulating unit, such as a fan, blower or motor and the like, can be separately provided or integrated, for example, in gas purification system 234, to circulate gas through gas purification loop 230. According to various embodiments of a gas enclosure assembly, though solvent removal system 232 and gas purification system 234 are shown as separate units in the schematic shown in FIG. 2, solvent removal system 232 and gas purification system 234 can be housed together as a single purification unit. Thermal regulation system 240 can include, for example, but not limited by, at least one chiller 241, which can have fluid outlet line 243 for circulating a coolant into a gas enclosure assembly, and fluid inlet line 245 for returning the coolant to the chiller.

For various embodiments of gas enclosure assembly 200, a gas source can be an inert gas, such as nitrogen, any of the noble gases, and any combination thereof. For various embodiments of gas enclosure assembly 200, a gas source can be a source of a gas such as clean dry air (CDA). For various embodiments of gas enclosure assembly 200, a gas source can be a source supplying a combination of an inert gas and a gas such as CDA.

Gas enclosure system 200 can maintain levels for each species of various reactive gas species, including various reactive atmospheric gases, such as water vapor and oxygen, as well as organic solvent vapors at 100 ppm or lower, for example, at 10 ppm or lower, at 1.0 ppm or lower, or at 0.1 ppm or lower. Further, various embodiments of a gas enclosure assembly can provide a low particle environment meeting a range of specifications for airborne particulate matter according to ISO 14644 Class 1 through Class 5 clean room standards.

While what is given in the above is an exemplary OLED inkjet print systems and gas enclosure systems, one skilled in the art can appreciate that such systems can be built with any combination of one or more of the devices and apparatuses of FIG. 1 and FIG. 2 as well as additional devices and apparatuses.

The final inkjet-printed product is an HIL having a highly uniform thickness and composition. For example, layers having a thickness variation no greater than 10% across the entire width of the layer are possible. The thickness across the layer can be measured using metrology tools, such as a stylus contact profilometer or an interferometer microscope. Suitable interferometers for optical interferometry are commercially available from Zygo instrumentation.

The ink compositions can be used to print the HILs directly in a multi-layered OLED architecture. A typical OLED comprises a support substrate, an anode, a cathode, a HIL disposed over the anode and a light-emitting layer (EML) disposed in between the HIL and the cathode. Other layers that may be present in the device, include a hole transporting layer provided between the HIL and the light-emitting layer to assist with the transport of holes to the light-emitting layer, and an electron transporting layer (ETL) disposed between the EML and the cathode. The substrate is generally a transparent glass or plastic substrate.

In these multi-layered architectures, one or more layers in addition to the HIL may be formed via inkjet printing, while other layers may be deposited using other film-forming techniques. Typically, the various layers will be formed within one or more pixel cells. Each pixel cell comprises a floor and is defined by a bank that defines the perimeter of the cell. The surfaces within a cell optionally may be coated with a surface-modifying coating, such as a surfactant. However, in some embodiments, such surfactants are absent, as they may quench the luminescence of the light-emitting layer.

FIG. 3 is a schematic illustration of a flat panel display comprising a plurality of OLEDs arranged in a matrix of pixel cells. FIG. 3 depicts an expanded view 320 of an area of panel 300, showing the arrangement 330 of a plurality of pixel cells, including a red light-emitting pixel cell 332, a green light-emitting pixel cell 334 and blue light-emitting pixel cell 336. Additionally, integrated circuitry 338 can be formed on a flat panel display substrate so that the circuitry is adjacent to each pixel cell for the purpose of applying voltage to each pixel in a controlled fashion during use. Pixel cell size, shape, and aspect ratios can vary depending on, for example, but not limited by, the resolution desired. For example, a pixel cell density of 100 ppi can be sufficient for a panel used for a computer display, where for high resolution of, for example of between about 300 ppi to about 450 ppi, can result in various pixel cell designs amenable to the effective packing of higher pixel density on a substrate surface.

While the disclosure above has focused on aqueous ink compositions formulated for inkjet printing polythiophene-based HILs, another aspect of the present technology provides non-aqueous, organic solvent-based ink compositions formulated for inkjet printing HILs or HTLs for OLEDs. The organic HIL/HTL ink compositions comprise a component that is conventionally viewed as a wetting agent, but that is incorporated into the HTL inks in carefully controlled quantities, such that it actually prevents the uncontrolled spreading and pixel cell spill-over that can occur as a result of wetting. In some embodiments, the organic inks comprise: (1) a hole injection material or a hole transporting material; (2) one or more organic solvents that solubilize the hole injection or hold transporting material; and (3) a fluorosurfactant. The hole injection or hole transporting material is typically present in an amount of no greater than about 5 wt. %, more typically no greater than 2 wt. % and still more typically no greater than about 1 wt. % (e.g., from about 0.1 to about 1 wt. %), based on total weight of the ink composition. Organic solvents typically account for about 95 to about 99.8 wt. % of the ink composition. The fluorinated surfactants are typically present in amounts of no greater than about 0.15 wt. %. For example, in some embodiments of the organic solvent-based ink compositions the fluorinated surfactants are present in amounts ranging from about 0.03 wt. % to about 0.1 wt. %.

Suitable hole injection materials for the organic solvent-based ink compositions include polythiophenes, as described above. Suitable hole transporting materials include polyvinyl carbazoles or derivatives thereof, polysilanes or derivatives thereof, polysiloxane derivatives having an aromatic amine at the side chain or the main chain, pyrazoline derivatives, arylamine derivatives, stilbene derivatives, triphenyldiamine derivatives, polyaniline or derivatives thereof, polythiophene or derivatives thereof, polyarylamines or derivatives thereof, polypyrroles or derivatives thereof, poly(p-phenylenevinylene) or derivatives thereof, or poly(2,5 thienylene vinylene) or derivatives thereof.

Suitable organic solvents for the HIL/HTL ink compositions include alkoxy alcohol, alkyl alcohol, alkyl benzene, alkyl benzoate, alkyl naphthalene, amyl octanoate, anisole, aryl alcohol, benzyl alcohol, butyl benzene, butyrophenone, cis-decalin, dipropylene glycol methyl ether, dodecyl benzene, mesitylene, methoxy propanol, methylbenzoate, methyl naphthalene, methyl pyrrolidinone, phenoxy ethanol, 1,3-propanediol, pyrrolidinone, trans-decalin, valerophenon, and mixtures thereof.

The fluorosurfactants are surfactants comprising a fluorinated alkyl chain. E. I. du Pont de Nemours and Company (Wilmington, Del.) sells fluorinated surfactants under the tradenames Capstone and Zonyl. The fluorosurfactants may be, for example, fluorotelomers (e.g., telomere B monoether with polyethylene glycol or 2-perfluoroalkyl) ethanol). Commercially available fluorosurfactants include Zonyl® FS 1033D, Zonyl® FS 1176, Zonyl® FSG, Zonyl® FS-300, Zonyl® FSN, Zonyl® FSH, Zonyl® FSN, Zonyl® FSO, Zonyl® FSN-100, Zonyl® FSO-100, Zonyl® FSH, Zonyl® FSN, Zonyl® FSO, Zonyl® FSH, Zonyl® FSN, Zonyl® FSO, Zonyl® FS 500, Zonyl® FS 510, Zonyl® FSJ, Zonyl® FS-610, Zonyl® 9361, Zonyl® FSA, FSP, FSE, FSJ, Zonyl® FSP, Zonyl® 9361, Zonyl® FSE, Zonyl® FSA, Zonyl® UR, Zonyl® 8867L, Zonyl® FSG, Zonyl® 8857A, Foraperle® 225, Forafac® 1268, Forafac® 1157, Forafac® 1183, Zonyl® 8929B, Zonyl® 9155, Zonyl® 9815, Zonyl® 9933LX, Zonyl® 9938, Zonyl® PFBI, Zonyl® PFBEI, Zonyl® PFBE, Zonyl® PFHI, Zonyl® BA, -8-Zonyl® PFHEI, Zonyl® TM, Zonyl® 8932, Zonyl® 7910, Zonyl® 7040, Foraperle® 321/325, Zonyl® 9464, Zonyl® NF, Zonyl® RP, Zonyl® 321, Zonyl® 8740, Zonyl® 225, Zonyl® 227, Zonyl® 9977, Zonyl® 9027, Zonyl® 9671, Zonyl® 9338, and Zonyl® 9582, Capstone® ST-500, Capstone® ST-300, Capstone® ST-200, Capstone® ST-110, Capstone® P-640, Capstone® P-623, Capstone® P-620, Capstone® P-600, Capstone® FS-10, Capstone® FS-17, Capstone® FS-22, Capstone® FS-30, Capstone® FS-31, Capstone® FS-3100, Capstone® FS-34, Capstone® FS-35, Capstone® FS-50, Capstone® FS-51, Capstone® FS-60, Capstone® FS-61, Capstone® FS-63, Capstone® FS-64, Capstone® FS-64, Capstone® FS-65, Capstone® FS-66, Capstone® FS-81, Capstone® FS-83, Capstone® LPA, Capstone® 1460, Capstone® 1157, Capstone® 1157D, Capstone® 1183, Capstone® CPS, Capstone® E, Capstone® LMC, Capstone® CP, Capstone® PSB, Capstone® 4-I, Capstone® 42-I, Capstone® 42-U, Capstone® 6-I, Capstone® 62-AL, Capstone® 62-I, Capstone® 62-MA, Capstone® TC, Capstone® TR, and Capstone® TS.

EXAMPLES

Example 1

Effect of Methicone on In-Pixel Uniformity

The following example illustrates the contact line pinning effect, and resulting improvement in luminescence uniformity, provided by methicone in an HIL inkjet ink composition.

Materials and Methods

Preparation of HIL Ink Compositions:

HIL ink compositions A and B were prepared with components and concentrations shown in Table 1. Both Compositions A and B include methicone in concentrations indicated. As a comparative example, an ink composition including the ingredients listed in Table 2, but lacking methicone, was prepared (Comparative Composition).

TABLE 1

| Ingredient | Composition A Wt. % | Composition B Wt. % |
|---|---|---|
| PEDOT | 34 | 34 |
| H$_2$O | 36.9 | 35.97 |
| Dimethyl propylene glycol methylether (DPGME) | 16 | 19 |
| 1,3-propanediol | 13 | 11 |
| Methicone (Botanisil S18) | 0.1 | 0.03 |
| Viscosity [cP] | 11.1 | 13.60 |
| ST [Dyne/cm] | 43.4 | 43 |

TABLE 2

| Ingredient | Comparative Composition Wt. % |
|---|---|
| PEDOT | 34 |
| H$_2$O | 36 |
| Dimethyl propylene glycol methylether (DPGME) | 16 |
| 1,3-propanediol | 13 |
| Methicone (Botanisil S18) | 0 |
| Viscosity [cP] | 11.1 |
| ST [Dyne/cm] | 43.4 |

The ink compositions were formulated by placing a clean vial on a balance and transferring the desired amount of Botanisil S-18 into the vial using a Pasteur pipette. The balance was tared and the 1,3-propanediol, water and DPGME were sequentially pipetted into the vial. The vial was then removed from the balance, capped and rotated to mix the resulting aqueous solution. The vial was then returned to the balance and the desired quantity of a PEDOT dispersion (Haraeus Clevios TM PVP A1 4083) was pipetted into the vial. The vial was then removed from the balance, capped and rotated to mix the PEDOT with the other components of the mixture. The resulting PEDOT ink composition was then filtered with a polytetrafluoroethylene (PTFE) filter membrane (2.0 μm) and the filtered composition was collected in an amber bottle. Finally, the bottle was sonicated for 15 minutes prior to use.

The comparative ink composition was made using the same procedure without the Botanisil S-18.

Viscosity and Surface Tension Measurements:

Viscosity measurements were carried out using a DV-I Prime Brookfield rheometer. Surface tension was measured with a SITA bubble pressure tensiometer. The measured values for the methicone-containing ink compositions A and B and the comparative ink composition (Comparative Composition) are provided in Tables 1 and 2.

HIL Inkjet Printing and OLED Fabrication:

The HIL ink compositions were printed onto ITO anodes in OLED architectures. The substrate of the OLED was glass, with a thickness of 0.5 mm, on which an anode of 60 nm ITO (indium tin oxide) was patterned. A bank material (also known as a pixel definition layer) was then patterned over the ITO, forming a cell into which the inkjet printed layers were deposited. The bank material was a negative working photoresist designed for inkjet printing. The resulting cells had banks with heights in the range from about 0.5 to 2 µm that were angled at 45° with respect to the floor of the cell, such that the opening of each cell was wider than its base. The 45° angle is representative of typical bank angles, which range from about 5° to about 70°. The width and length dimensions of the cells were about 60×175 µm. An HIL layer was then ink-jet printed, using the ink compositions of Tables 1 and 2, into the cell, dried under vacuum and baked at an elevated temperature in order to remove the water and solvents from the layer.

The HIL ink composition was printed at room temperature using the inkjet printing system described in PCT application publication no. WO 2013/158310, the entire disclosure of which is incorporated herein by reference. Inkjet printing into the pixel cells was carried out by filling a bulk ink reservoir with the HIL ink composition. The bulk ink reservoir was in fluid communication with a primary dispensing reservoir and a continuous supply of the HIL ink composition was provided to the primary dispensing reservoir during printing. The HIL ink composition was then fed into a printhead comprising a plurality of nozzles through which the HIL ink composition was jetted into the pixel cells. Typical drop volumes during printing were about 10 pl and about 3 to 10 drops were printed into each cell to form a droplet of the ink composition in the cell.

An OLED incorporating an HIL that is printed from the Ink Composition A is fabricated as follows. An HTL layer is inkjet printed onto the HIL layer, followed by drying under vacuum and baking at an elevated temperature to remove solvent and induce the crosslinking in the crosslinkable polymer. Then the EML layer is inkjet printed onto the HTL layer, followed by drying under vacuum and baking at an elevated temperature to remove solvent. The HTL and EML layers are inkjet printed using the printer described above. The HTL ink composition is comprised of a hole transporting polymer material in an ester-based solvent system composed of a mixture of distilled and degassed diethyl octanoate and octyl octanoate in a weight ratio of 1:1. The EML ink composition is comprised of an organic electroluminescent material in diethyl sebacate.

An ETL layer, followed by a cathode layer, was then applied by vacuum thermal evaporation. The ETL material comprised lithium quinolate (LiQ) as an emissive material and the cathode layer was composed of 100 nm of aluminum.

Results

Figure 4A:
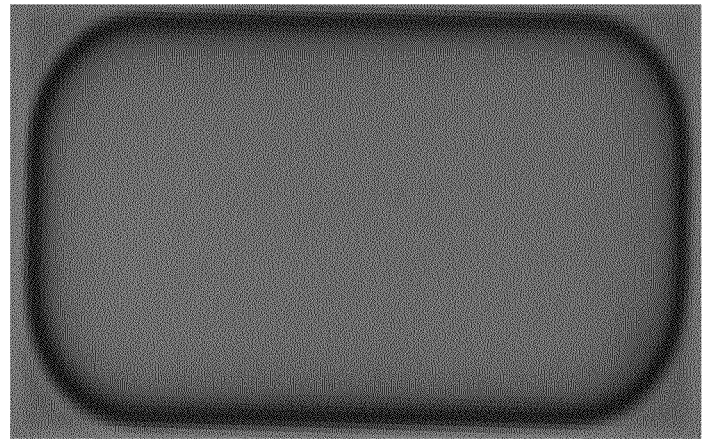
FIG. 4A is a microphotograph image of an ink composition containing 0.08 wt. % methicone pinned in an OLED pixel cell.
Figure 4B:
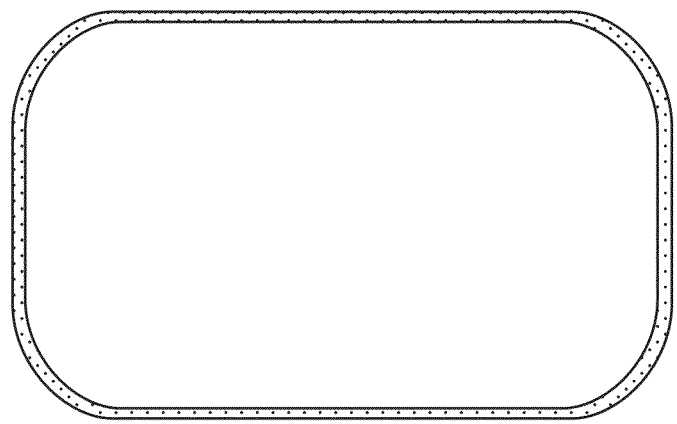
FIG. 4B is a black and white line drawing of the microphotograph in FIG. 4A
Figure 5A:
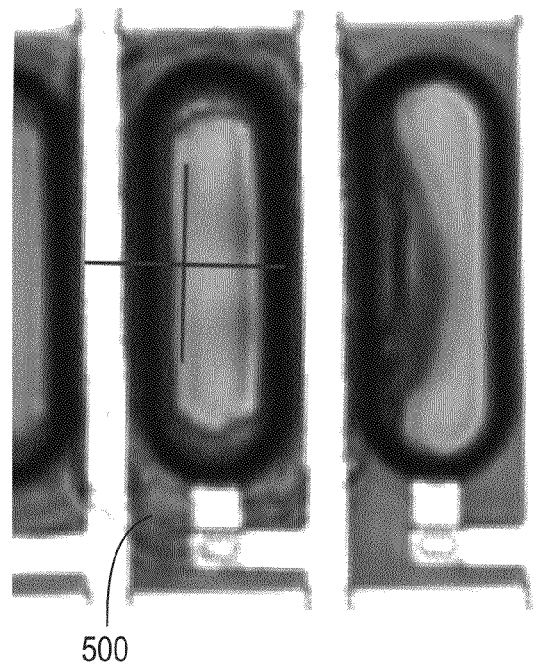
FIG. 5A is a microphotograph image of an ink composition that is free of methicone spilling over an OLED pixel cell.
Figure 5B:
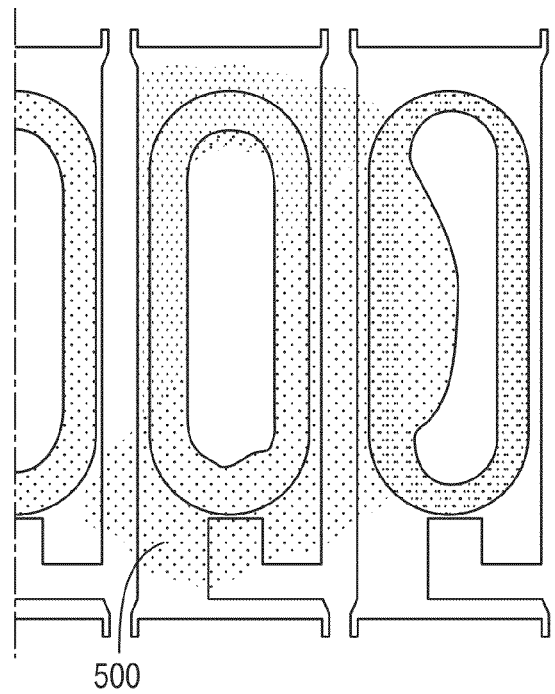
FIG. 5B is a black and white line drawing of the microphotograph in FIG. 5A.
Figure 6A:
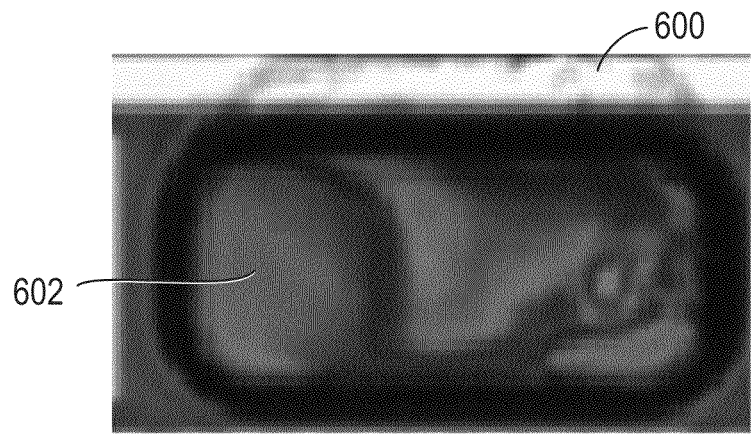
FIG. 6A is a microphotograph image of an ink composition that is free of methicone dewetting an OLED pixel cell.
Figure 6B:
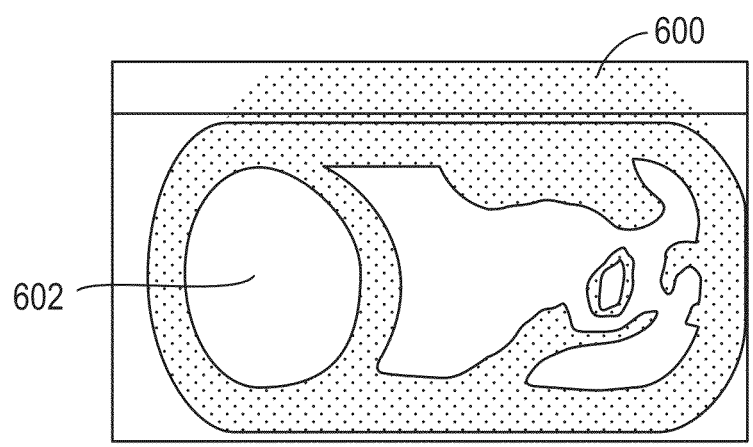
FIG. 6B is a black and white line drawing of the microphotograph in FIG. 6A.

Droplets of Compositions A and B printed into pixel cells were pinned to the pixel banks and experienced neither spill-over nor pull-back. An image of an HIL layer made using Composition A (0.1 wt. % methicone) printed in, and pinned to, a pixel cell is shown in FIG. 4A. In contrast, images of the Comparative Composition printed into pixel cells (FIGS. 5 and 6) show that in the absence of methicone, the ink composition spread uncontrollably and spilled over 500 the sides of the pixel cell (FIG. 5A) or pulled back from the banks of the pixel cell (de-wetting) creating de-wetted areas 602 on the floor of the cell combined with some pixel cell spill over 600 (FIG. 6A).

For each microphotograph shown in FIGS. 4A-6A, described above, and shown in FIGS. 7A-9A, described below, a black and white line drawing is provided and labeled as the corresponding 'B' figure.

Figure 7A:
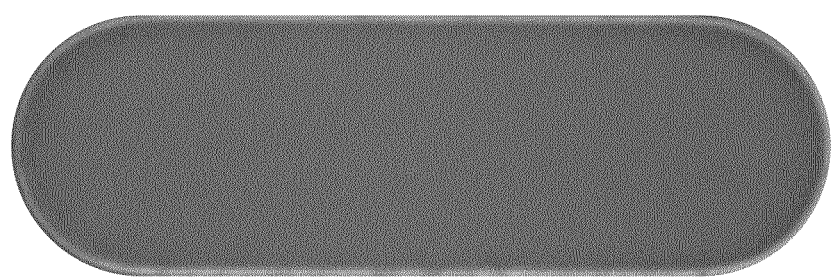
FIG. 7A is a microphotograph of the luminescence emitted from an OLED pixel having an HIL printed with an ink composition comprising methicone as a pinning agent.
Figure 7B:
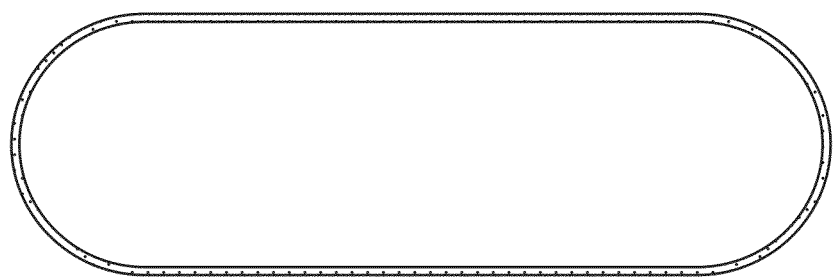
FIG. 7B is a black and white line drawing of the microphotograph in FIG. 7A.

The electroluminescence properties of an OLED pixel including an inkjet printed HIL made with Composition A was also investigated. Once the OLED was fabricated, the uniformity of its electroluminescence was investigated by applying an electrical current across the diode and imaging the light emission. The resulting luminescence is shown in the photomicrograph of FIG. 7A. As can be seen in that figure, the HIL layer printed with Ink Composition A contributed to the uniform luminescence of the OLED pixel into which it was incorporated.

Example 2

Effect of Sulfolane on Printing Properties

The following example illustrates the improved printing properties imparted to the HIL ink compositions by sulfolane.

Materials and Methods

Preparation of HIL Ink Composition:

A HIL ink composition including methicone, sulfolane and the other ingredients listed in Table 3 was prepared.

TABLE 3

| Ingredient | Wt. % |
| --- | --- |
| PEDOT | 59.9 |
| DPGME | 5 |
| Sulfolane | 10 |
| $H_2O$ | 25 |
| Surfactant (S18) | 0.1 |
| Viscosity [cP] | 5.9 |
| ST [Dyne/cm] | 45.0 |

The ink composition was formulated as described in Example 1, except that sulfolane was used in place of the 1,3-propanediol.

Viscosity and Surface Tension Measurements:

Viscosity and surface tension measurements were carried out as in Example 1.

HIL Inkjet Printing and OLED Fabrication:

The HIL ink compositions were printed and OLED pixels were formed for electroluminescence testing as described in Example 1.

Latency Measurements:

Latency measurements for the inks were carried out using the inkjet printing system described in PCT application publication no. WO 2013/158310. The measurements were conducted by firing one nozzle and measuring 300 data points of volume, velocity, and directionality. The nozzle was then idled for 30 minutes. After 30 minutes the nozzle was restarted and 300 more data points were recorded.

The data sets were plotted and compared to look for any starting effects (usually velocity drop and volume change) at the beginning of the second set of data (after the 30 minute idle) compared to steady-state jetting (end of the first data set, before the 30 minute idle).

Latency measurements for the inks were also carried out using a Dimatix Fujifilm DMP-2831 printer. In the drop watching setting all 16 nozzles were turned on and it was confirmed that all nozzles were firing. Jetting was then stopped for 5 min. Jetting was resumed and inspection confirmed that all nozzles were still working. Then, continuous jetting was carried out for periods of 15 and 30 min. Latency time was measured as the time between the end of jetting and the onset of the drying of the ink in the uncapped nozzle, which results in improper droplet firing. To determine when the ink compositions dried they were inspected under a microscope in white light and fluorescent modes.

Results

Figure 8A:
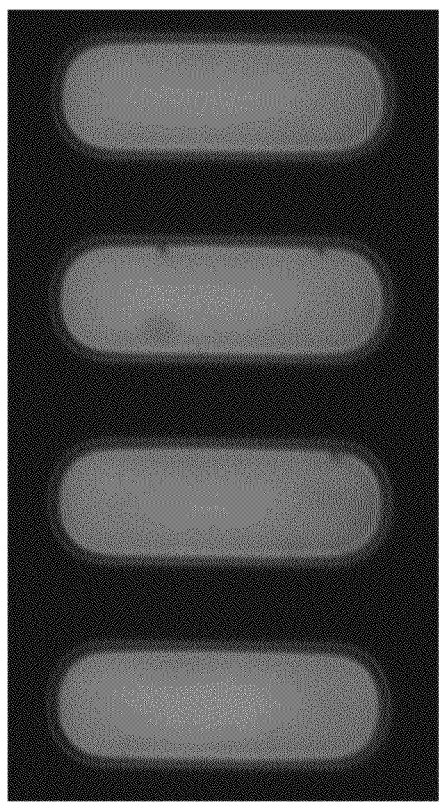
FIG. 8A is a microphotograph of the luminescence emitted from OLED pixels in which the HILs were printed with an ink composition comprising methicone as a pinning agent and sulfolane as an organic solvent.
Figure 8B:
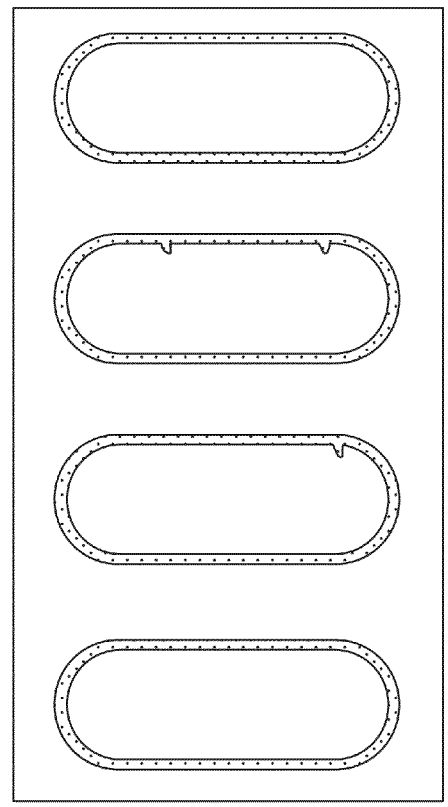
FIG. 8B is a black and white line drawing of the microphotograph in FIG. 8A.
Figure 9A:
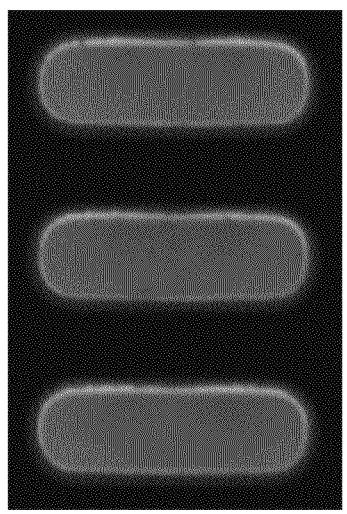
FIG. 9A is a microphotograph of the luminescence emitted from OLED pixels in which the HILs were printed with an ink composition comprising methicone as a pinning agent and 1,3-propanediol as an organic solvent.
Figure 9B:
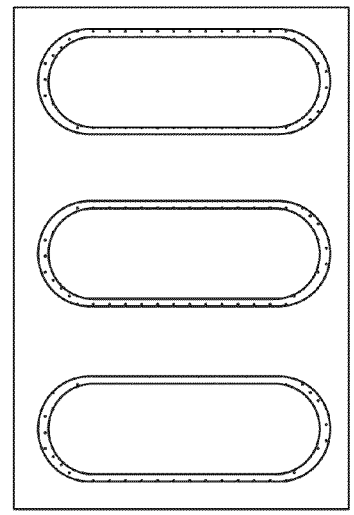
FIG. 9B is a black and white line drawing of the microphotograph in FIG. 9A.

Once the OLEDs were fabricated, the uniformity of their electroluminescence was investigated by applying an electrical current across each diode and imaging the light emission. Electroluminescence was measured for the OLED having an HIL printed from the ink composition of Table 3 and for the OLED having an HIL printed from the ink composition of Table 1. A comparison of the microphotographs of FIGS. 8 and 9, shows that sulfolane in the HIL ink composition provides a more uniform pixel luminescence (FIG. 8A) than does propanediol (FIG. 9A).

Figure 10:
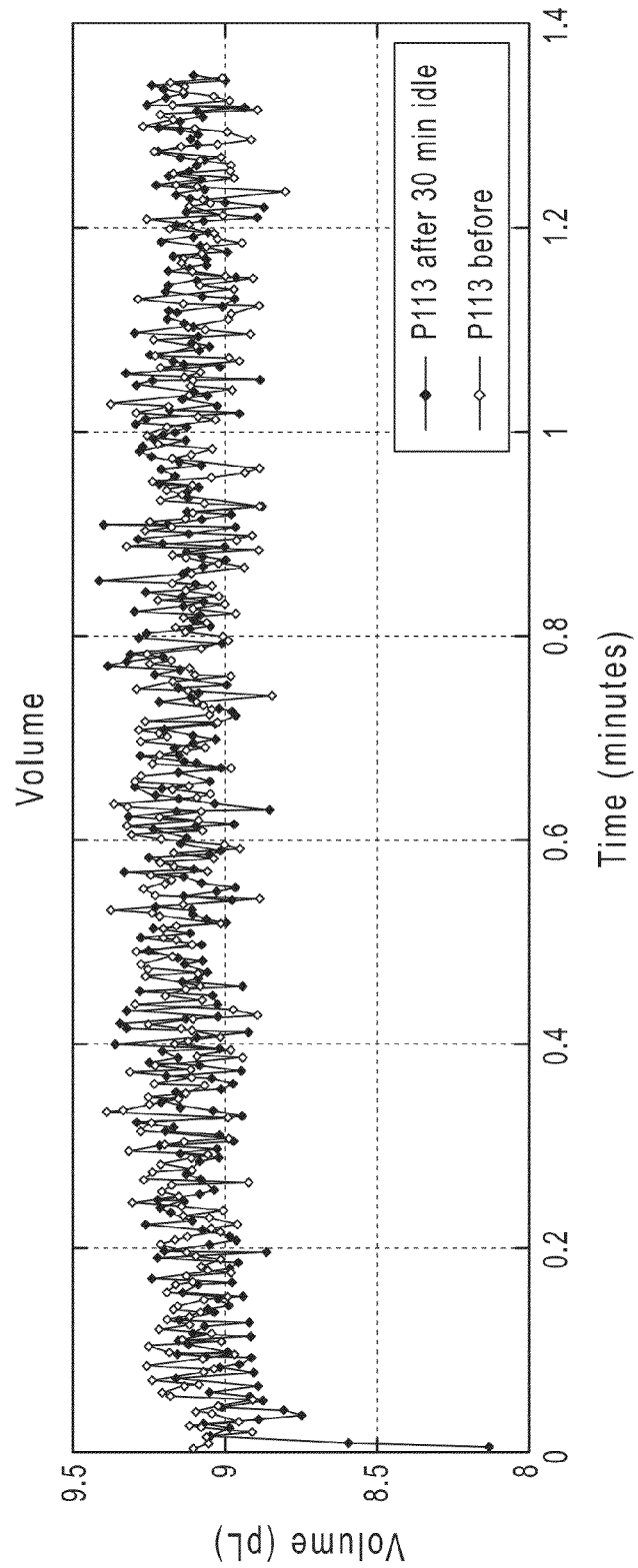
FIG. 10 is a graph of drop volume over time for an ink composition before and after a 30 minute idle of the inkjet printing nozzle, as described in Example 2.
Figure 11:
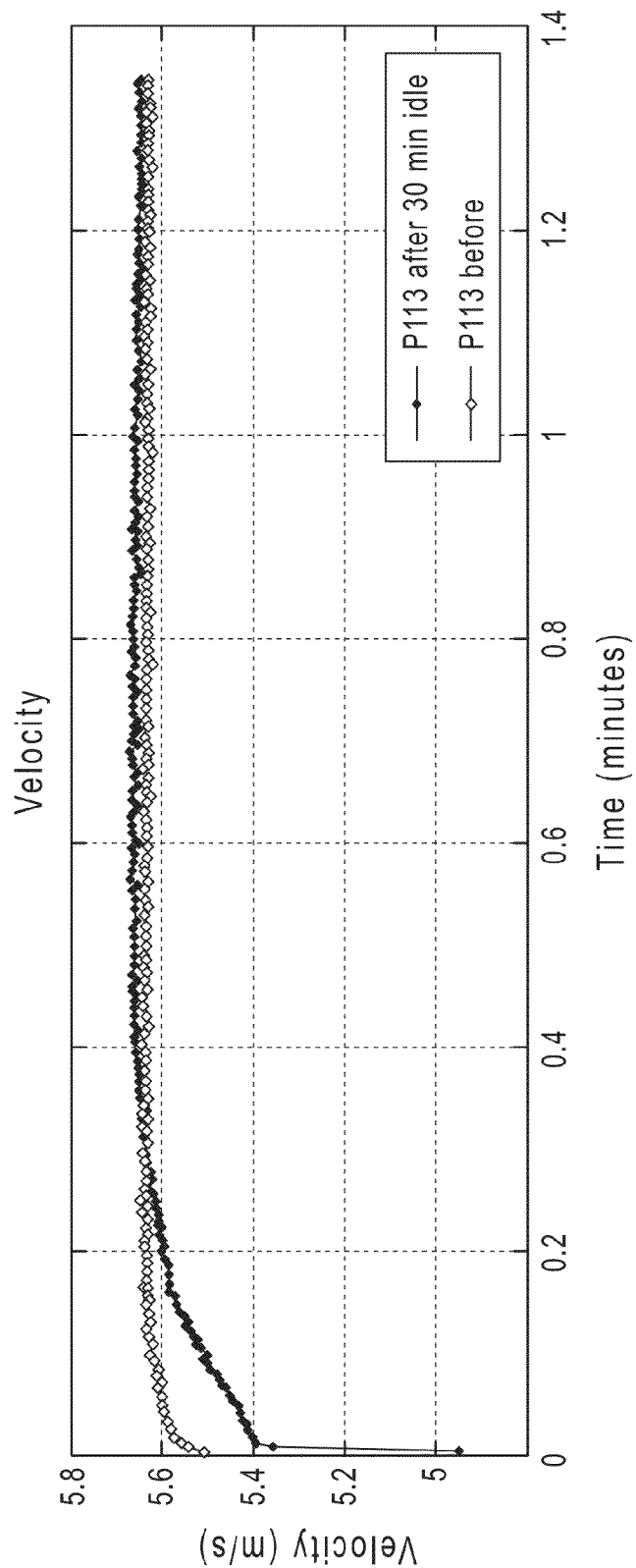
FIG. 11 is a graph of drop velocity over time for an ink composition before and after a 30 minute idle of the inkjet printing nozzle, as described in Example 2.
Figure 12:
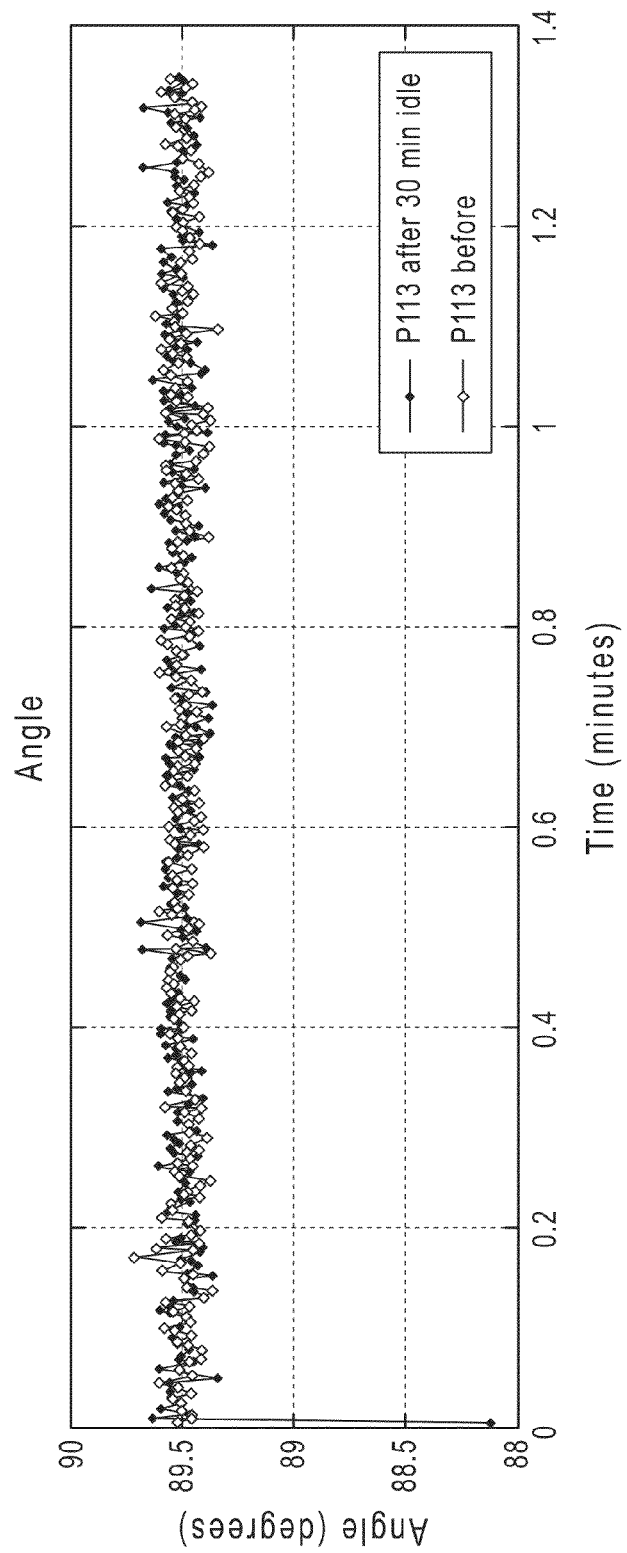
FIG. 12 is a graph of drop angle over time for an ink composition before and after a 30 minute idle of the inkjet printing nozzle, as described in Example 2.

In addition, the maximum stable jetting frequency for the sulfolane-containing ink composition (1000 Hz) was higher than that for the diol-containing ink composition. Finally, the latency time for the sulfolane-containing ink composition was over 30 minutes, compared to only 15 minutes for the diol-containing ink composition. The results for the latency tests measured using the inkjet printing system described in PCT application publication no. WO 2013/158310, are shown in FIGS. 10 to 12. In these graphs, the sulfolane-containing ink is designated P113. FIG. 10 is a graph of drop volume over 14 minutes for the ink composition before idle and after a 30 minute idle. FIG. 11 is a graph of drop velocity over 14 minutes for the ink composition before idle and after a 30 minute idle. As can be seen in this figure, the drop velocity at restart was only 4% lower than the drop velocity before the idle. FIG. 12 is a graph of drop angle over 14 minutes for the ink composition before idle and after a 30 minute idle. No significant difference in drop angle before and after idle was observed.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An ink composition comprising:
   at least 40 wt. % of an electrically conductive polythiophene;
   at least 5 wt. % of an aprotic organic solvent having a boiling point of no greater than 240° C., a viscosity of no greater than 15 cPs at 25° C. and a surface tension of no greater than 55 dyne/cm at 25° C.; and
   water.

2. The ink composition of claim 1 comprising at least 50 wt. % of the electrically conductive polythiophene and at least 10 wt. % of the aprotic organic solvent.

3. The ink composition of claim 1, wherein the aprotic organic solvent has a viscosity of no greater than 10 cPs at 25° C.

4. The ink composition of claim 1 further comprising a propylene glycol methyl ether co-solvent, wherein the aprotic organic solvent is the majority organic solvent in the ink composition.

5. The ink composition of claim 1, wherein the aprotic organic solvent is sulfolane.

6. The ink composition of claim 5, wherein the electrically conductive polythiophene is poly(3,4-ethylenedioxythiophene).

7. The ink composition of claim 6 comprising at least 55 wt. % of the poly(3,4-ethylenedioxythiophene).

8. The ink composition of claim 5 further comprising a propylene glycol methyl ether co-solvent, wherein the sulfolane is the majority organic solvent in the ink composition.

9. The ink composition of claim 6 further comprising a propylene glycol methyl ether co-solvent, wherein the sulfolane is the majority organic solvent in the ink composition, and further wherein the ink composition comprises 50 wt. % to 70 wt. % of the poly(3,4-ethylenedioxythiophene) and 5 wt. % to 15 wt. % of the sulfolane.

10. The ink composition of claim 1, wherein the aprotic organic solvent is propylene carbonate.

11. The ink composition of claim 1, wherein the aprotic organic solvent is dimethylpropylene urea.

12. A method of forming a hole injecting layer for an organic light emitting diode, the method comprising:
   inkjet printing a droplet of an ink composition over an electrode layer in a pixel cell of an organic light emitting diode pixel bank, the ink composition comprising:
      at least 40 wt. % of an electrically conductive polythiophene;
      at least 5 wt. % of an aprotic organic solvent having a boiling point of no greater than 240° C., a viscosity of no greater than 15 cPs at the printing temperature and a surface tension of no greater than 55 dyne/cm at the printing temperature; and
      water; and
   allowing the volatile components of the ink composition to evaporate, whereby the hole injecting layer is formed.

13. The method of claim 12, wherein the ink composition comprises at least 50 wt. % of the electrically conductive polythiophene and at least 10 wt. % of the aprotic organic solvent.

14. The method of claim 12, wherein the aprotic organic solvent has a viscosity of no greater than 10 cPs at the printing temperature.

15. The method of claim 12, wherein the ink composition further comprises a propylene glycol methyl ether co-solvent, wherein the aprotic organic solvent is the majority organic solvent in the ink composition.

16. The method of claim 12, wherein the aprotic organic solvent is sulfolane.

17. The method of claim 16, wherein the electrically conductive polythiophene is poly(3,4-ethylenedioxythiophene).

18. The method of claim 17, wherein the ink composition comprises at least 55 wt. % of the poly(3,4-ethylenedioxythiophene).

19. The method of claim 16, wherein the ink composition further comprises a propylene glycol methyl ether co-solvent, wherein the sulfolane is the majority organic solvent in the ink composition.

20. The method of claim 17, wherein the ink composition further comprises a propylene glycol methyl ether co-solvent, wherein the sulfolane is the majority organic solvent in the ink composition, and further wherein the ink composition comprises 50 wt. % to 70 wt. % of the poly(3,4-ethylenedioxythiophene) and 5 wt. % to 15 wt. % of the sulfolane.

21. The method of claim 12, wherein the aprotic organic solvent is propylene carbonate.

22. The method of claim 12, wherein the aprotic organic solvent is dimethylpropylene urea.

\* \* \* \* \*